United States Patent
Yap et al.

(10) Patent No.: US 8,927,345 B2
(45) Date of Patent: Jan. 6, 2015

(54) DEVICE PACKAGE WITH RIGID INTERCONNECT STRUCTURE CONNECTING DIE AND SUBSTRATE AND METHOD THEREOF

(75) Inventors: Weng Foong Yap, Phoenix, AZ (US); Lai Cheng Law, Cheras (MY); Boh Kid Wong, Ipoh (MY)

(73) Assignee: Freescale Semiconductor, Inc., Austin, TX (US)

( * ) Notice: Subject to any disclaimer, the term of this patent is extended or adjusted under 35 U.S.C. 154(b) by 33 days.

(21) Appl. No.: 13/544,430

(22) Filed: Jul. 9, 2012

(65) Prior Publication Data
US 2014/0008811 A1     Jan. 9, 2014

(51) Int. Cl.
H01L 21/00     (2006.01)
H01L 23/48     (2006.01)
H01L 23/52     (2006.01)
H01L 29/40     (2006.01)
H01L 21/4763   (2006.01)

(52) U.S. Cl.
USPC .... 438/127; 256/689; 256/774; 256/E21.502; 438/618

(58) Field of Classification Search
USPC ............. 257/686, 689, 700, 758, E23.141, 257/E23.142, E23.151, E23.178; 438/107, 438/127
See application file for complete search history.

(56) References Cited

U.S. PATENT DOCUMENTS

| | | | |
|---|---|---|---|
| 7,355,289 B2 | 4/2008 | Hess et al. | |
| 2005/0046046 A1* | 3/2005 | Chiu et al. | 257/787 |
| 2008/0090335 A1* | 4/2008 | Morimoto et al. | 438/118 |
| 2008/0246165 A1 | 10/2008 | Hess et al. | |
| 2008/0303120 A1* | 12/2008 | Lee et al. | 257/659 |
| 2010/0258934 A1* | 10/2010 | Chang Chien et al. | 257/690 |
| 2010/0270663 A1 | 10/2010 | Johnston et al. | |
| 2011/0095403 A1* | 4/2011 | Lee et al. | 257/660 |
| 2011/0169133 A1* | 7/2011 | Arai | 257/532 |
| 2011/0309404 A1* | 12/2011 | Lee | 257/99 |
| 2012/0025401 A1 | 2/2012 | Lee et al. | |

OTHER PUBLICATIONS

Kazuhito Hikasa et al., "Development of Flexible Bumped Tape Interposer". Furukawa Review, No. 24, Oct. 2003, pp. 59-64.

* cited by examiner

*Primary Examiner* — William F Kraig
*Assistant Examiner* — Khaja Ahmad

(57) ABSTRACT

A method comprises fabricating an interconnect structure comprising a plurality of conductive interconnects encased in a dielectric structure and coupling each of the conductive interconnects to a corresponding bond pad of a package substrate and bond pad of a die. A device package comprises a substrate having a first plurality of bond pads disposed at a first surface of the substrate and a die having a first surface facing the first surface of the substrate and a second surface opposite the first surface, the die comprising a second plurality of bond pads disposed at the second surface. The device package further comprises an interconnect structure comprising a plurality of conductive interconnects encased in a dielectric structure, each of the conductive interconnects coupled to a corresponding bond pad of the first plurality of bond pads and to a corresponding bond pad of the second plurality of bond pads.

19 Claims, 8 Drawing Sheets

DEVICE PACKAGE WITH RIGID INTERCONNECT STRUCTURE CONNECTING DIE AND SUBSTRATE AND METHOD THEREOF

FIELD OF THE DISCLOSURE

The present disclosure relates generally to semiconductor devices or microelectromechanical devices and more particularly to packaging such devices.

BACKGROUND

The fabrication of semiconductor devices and microelectromechanical (MEMS) devices often involves the electrical connection of bond pads of a die to corresponding bond pads of a package substrate. Controlled Collapse Chip Connection (C4) (also colloquially referred to as "flip chip") and wirebonding are two of the most frequently used interconnect techniques for establishing these electrical connections. Wirebonding techniques typically are more tolerant of coefficient of thermal expansion (CTE) mismatch between the die and package substrate, but are susceptible to high yield loss due to wire shorts. While flip chip interconnect techniques allow for a smaller package footprint than wirebonding, the lack of a carrier in flip chip packages often makes replacement or manual installation of the die impracticable. Moreover, flip chip interconnect techniques typically require very flat surfaces for mounting, and are more susceptible to solder joint cracking due to CTE mismatch between the die and package substrate.

BRIEF DESCRIPTION OF THE DRAWINGS

The present disclosure may be better understood, and its numerous features and advantages made apparent to those skilled in the art by referencing the accompanying drawings.

DETAILED DESCRIPTION

Figure 1:
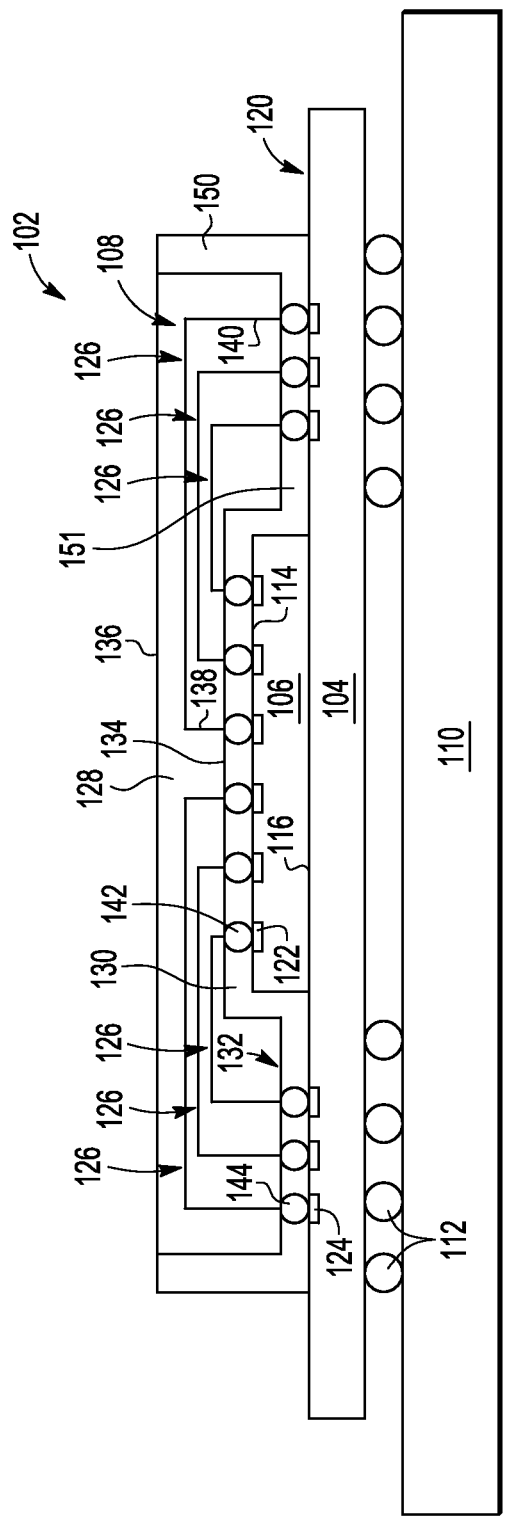
FIG. 1 is a diagram illustrating a cross-section view of a device package comprising a rigid interconnect structure electrically connecting bond pads of a die to bond pads of a package substrate in accordance with at least one embodiment of the present disclosure.

FIGS. 1-8 illustrate example techniques for fabricating a device package using a rigid interconnect structure to electrically connect bond pads of a die with bond pads of a package substrate. The bottom surface of the die is bonded or otherwise affixed to the top surface of the package substrate. The rigid interconnect structure includes conductive interconnects embedded or encapsulated in a rigid dielectric material, such as epoxy, plastic, or ceramic. Each of at least a subset of the conductive interconnects includes one end disposed at, and accessible via, the bottom surface of the rigid interconnect structure and another end disposed within, and accessible via, a cavity at the bottom surface of the rigid interconnect structure. The cavity encases a top portion of the die such that one set of solder bumps electrically connect the ends of the conductive interconnects disposed in the cavity with corresponding bond pads at the top surface of the die and another set of solder bumps electrically connect the ends of the metal connects disposed at the bottom surface of the rigid interconnect structure with corresponding bond pads at the top surface of the package substrate. In this manner, the rigid interconnect structure combines the advantages of tolerance for a less flat surface and more CTE mismatch afforded by wirebonding techniques while reducing or eliminating the disadvantage of wire shorting often found in wirebonding techniques.

In one embodiment, the rigid interconnect structure is fabricated through a molding process whereby one or more metal wire layers comprising corresponding sets of metal wires are placed in a molding frame, which is then filled with a molding compound such as epoxy or plastic. Once the molding compound is cured or set, the resulting rigid interconnect structure is removed from the mold frame and a cavity is formed through, for example, grinding, chemical etching, or laser ablation, so as to accommodate the top surface of the die within the rigid interconnect structure. In another embodiment, the cavity is formed during the molding process through the use of a corresponding projection in the mold frame. Alternatively, the rigid interconnect structure may be formed in a layer build-up process whereby alternating dielectric and conductive layers are fabricated to form the dielectric member and the horizontal conductive components of the conductive interconnects. Metalized vias then may be formed in the resulting structure to provide the vertical conductive components of the conductive interconnects.

For ease of illustration, the techniques of the disclosure are described in an example context whereby a single die is connected to a package substrate via a rigid interconnect structure. However, the present disclosure is not limited to this example context. Rather, the techniques described herein may be used to fabricate and integrate a rigid interconnect structure that electrically connects multiple die to a package substrate without departing from the scope of the present disclosure.

FIG. 1 illustrates a cross-section view of an electronic device 100 implementing a device package 102 in accordance with at least one embodiment of the present disclosure. The device package 102 comprises a package substrate 104 and a die 106 electrically coupled via a rigid interconnect structure 108. The device package 102 is electrically coupled to a printed circuit board (PCB) or other carrier 110 for implementation in the electronic device 100. The electronic device 100 can include any of a variety of electronic devices, such as an electronic control system of an automobile or other vehicle, a portable electronic device such as a cellular phone, tablet computer, or notebook computer, a desktop computer, a server, and the like.

The package substrate 104 comprises an interposer or other substrate that physically and electrically connects the device package 102 to the carrier 110 via one or more interconnect pins, such as ball pins 112. The package substrate 104 can comprise a rigid substrate composed of one or more layers of, for example, FR4 epoxy or Bismaleimide-Triazine (BT) resin, or the package substrate 104 can comprise a flexible substrate, such as a tape substrate composed of, for example, polyimide or other polymer. The die 106 comprises one or more substrate layers upon which semiconductor integrated circuit devices or microelectromechanical systems (MEMS) are formed. The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like. The die 106 comprises two major opposing surfaces, labeled top surface 114 and bottom surface 116 ("top" and "bottom" being relative to the orientation shown in FIG. 1). The die 106 is adhesively bonded or otherwise affixed (via screws, clams, or pins, etc.) to the package substrate 104 such that the bottom surface 116 is facing and proximate to a top surface 120 of the package substrate 104. The die 106 includes bond pads 122 disposed at the top surface 114. The bond pads 122 are electrically coupled to corresponding IC devices or MEMS of the die 106. Similarly, the package substrate 104 includes bond pads 124 at the top surface 120.

The rigid interconnect structure 106 comprises a plurality of conductive interconnects 126 encapsulated by a rigid dielectric structure 128. The rigid dielectric structure 128 has a cavity 130 formed at the bottom surface 132, whereby the cavity 130 has a top surface 134 in a plane between the plane formed by the bottom surface 132 and the plane formed by the top surface 136 of the rigid dielectric structure 128. The cavity 130 is dimensioned so as to encase or otherwise accommodate a top portion of the die 106 such that the top surface 134 of the cavity 130 is proximate to the top surface 114 of the die 106 when the die 106 is inserted or otherwise positioned in the cavity 130. As part of this dimensioning, the cavity 130 includes a depth that permits both the surface 134 to be proximate to the surface 114 and the surface 132 to be proximate to the surface 120 of the package substrate 104. As the solder joints 122 separate the surfaces 114 and 134 and the solder joints 144 separate the surfaces 120 and 132, this condition can be achieved by fabrication the cavity 130 to have a depth approximately equal to the sum of the height of the surface 114 from the surface 120 and the height of the solder joints 142 less the height of the solder joints 144.

The conductive interconnects 126 each comprise one end disposed at the top surface 134 of the cavity 130 (end 138) and a second end disposed at the bottom surface 132 (end 140). The ends 138 of the conductive interconnects 126 are coupled to corresponding bond pads 122 of the die 106 via the solder bumps 142. The ends 140 of the conductive interconnects 128 are coupled to corresponding bond pads 124 of the substrate 104 via the solder joints 144. Any gaps between the rigid interconnect structure 108, the die 106, and the package substrate 104 may be filled using an underfill process so as to form an underfill structure 150. The underfill structure 150 includes an underfill layer 151 disposed between the top surfaces 114 and 120 of the die 106 and the package substrate 104, respectively, and the surfaces 132 and 134 of the rigid interconnect structure 108. This underfill layer 151 may further adhere the rigid interconnect structure 108 to the die 106 and the package substrate 104 so as to provide greater mechanical integrity.

As described in greater detail below with reference to FIGS. 3-7, in one embodiment the rigid interconnect structure 108 is formed by positioning one or more layers of metal wires in a mold frame and then encapsulating the metal wires in a molding compound to form the rigid interconnect structure 108, whereby the metal wires comprise the conductive interconnects 126 and the molding compound, so molded, comprises the rigid dielectric structure 128. The molding compound may include, for example, an epoxy, an organic plastic substrate, a liquid encapsulant, or a ceramic, as well as various other compounds, such as aluminum nitride (AlN), Alumina (Al2O3), or Beryllia (BeO). Alternatively, as described in greater detail below with reference to FIG. 8, the rigid interconnect structure 108 can be formed by adapting conventional semiconductor processing techniques to building up multiple interleaved dielectric layers and metal routing layers and then forming conductive vias to connect the metal traces at the metal routing layers to the surfaces 132 and 134. Thus, the metal traces at each metal routing layer form the horizontal members of corresponding conductive interconnects 126 and the conductive vias form the vertical members of corresponding conductive interconnects 126 ("horizontal" and "vertical" being relative to the orientation of the view of FIG. 1).

As illustrated by FIG. 1, the conductive interconnects 126 electrically connect the bond pads 122 of the die 106 to the bond pads 124 of the package substrate 124 (via solder bumps 142 and 144) in a manner that permits the die 106 to be oriented with the package substrate 104 in the same manner as a conventional wirebonding technique. However, unlike conventional wirebonding techniques, the rigid interconnect structure 108 is less susceptible to wire shorts as the rigid dielectric material encapsulating each conductive interconnect 126 electrically and mechanically isolates each conductive interconnect 126 from the others. Moreover, because the CTE mismatches between the die 106 and the rigid dielectric structure 128 and between the package substrate 104 and the rigid dielectric structure 128 can be less than the CTE mismatch between the die 106 and the package substrate 104, the illustrated technique of using the rigid interconnect structure 108 to interconnect the die 106 and the package substrate 104 can be less susceptible to solder joint cracking than the use of a conventional flip chip interconnect technique for interconnecting the die 106 and the package substrate 104.

Figure 2:
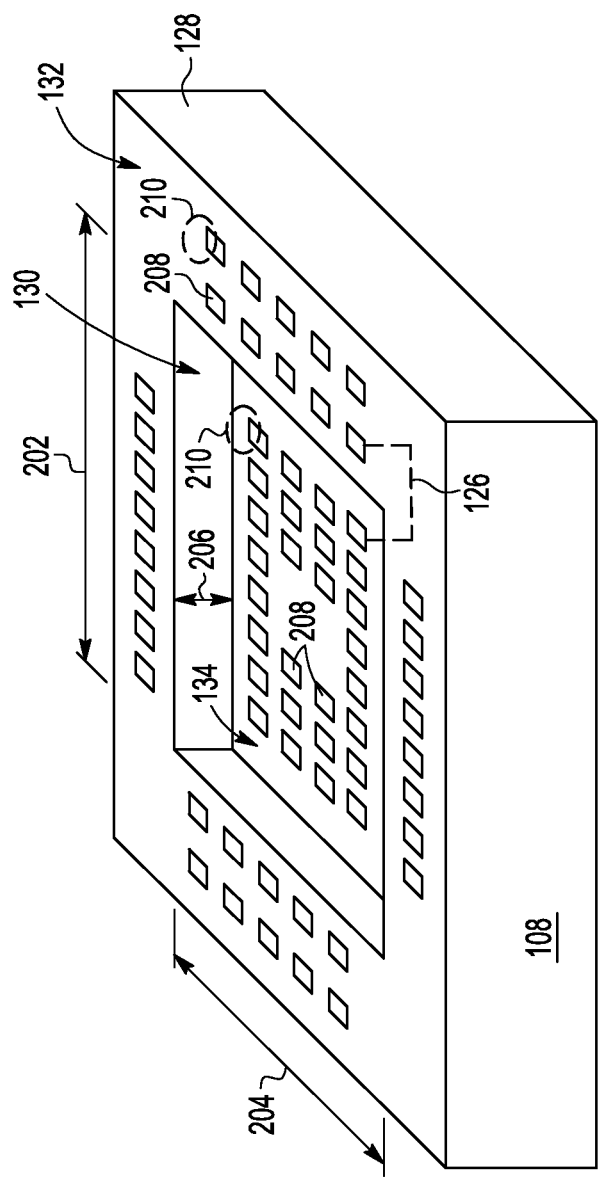
FIG. 2 is a diagram illustrating a perspective view of a die-facing side of a rigid interconnect structure in accordance with at least one embodiment of the present disclosure.

FIG. 2 illustrates a perspective view of the bottom surface 132 of the rigid interconnect structure 108 in accordance with at least one embodiment of the present disclosure. As depicted and as described above, the rigid interconnect structure 108 comprises the plurality of conductive interconnects 126 encapsulated in the rigid dielectric structure 128, and whereby the cavity 130 is formed at the bottom surface 132. As also described above, the cavity 130 is dimensioned so as to accommodate the top portion of the die 106. Thus, the cavity 130 includes a width 202 greater than a width of the top surface 114 of the die 106, a length 204 greater than the length of the top surface 114, and a depth 206 that permits the die 106 to be inserted into the cavity 130 so as to place the surface 114 of the die 106 proximate to the surface 134 of the cavity 130 and the surface 120 of the package substrate 104 proximate to the surface 132 of the rigid interconnect structure 108. As noted above with reference to FIG. 1, this depth 206 can be approximately equal to the sum of the height of the surface 114 from the surface 120 and the height of the solder joints 142 (FIG. 1) less the height of the solder joints 144 (FIG. 1). Although FIG. 2 illustrates an example whereby the cavity 130 has a rectangular perimeter, the cavity 130 may have any of a variety of shapes. For example, the cavity 130 may have a circular perimeter, and thus take on a cylindrical volume.

In one embodiment, the dimensions of the ends of the conductive interconnects 126 exposed at the surfaces 132 and 134 are sufficient to provide reliable electrical coupling via reflowed solder. In another embodiment, bond pads 208 may be formed at the ends of the conductive interconnects 126 to facilitate solder bonding. Further, to form the solder joints 122 and 124 (FIG. 1), solder bumps 210 may be formed at the bond pads 208 (or directly at the exposed ends of the conductive interconnects 126), the rigid interconnect structure 108 then positioned over the die 106 and package substrate 104 so as to place the solder bumps 210 in contact with both the bond pads 208 (or exposed ends of the conductive interconnects 126) and the corresponding bond pads 122 or 124 of the die 106 and package substrate 104. The solder bumps 210 then may be reflowed to form the corresponding solder joints connecting the conductive interconnects 126 to the bond pads 122 and 124. In another embodiment, solder bumps instead may be formed at the bond pads 122 and 124 of the die 106 and the package substrate 104, respectively, rather that at the bond pads 208 of rigid interconnect structure 108.

FIGS. 3-7 illustrate a process of fabricating the device package 102 using a premolded implementation of the rigid interconnect structure 108 whereby a metal wire stack comprising one or more stacked metal wire layers comprising metal wires (one embodiment of the conductive interconnects 126) are encapsulated in molding compound that is cured or set in a mold frame having the desired shape.

Figure 3:
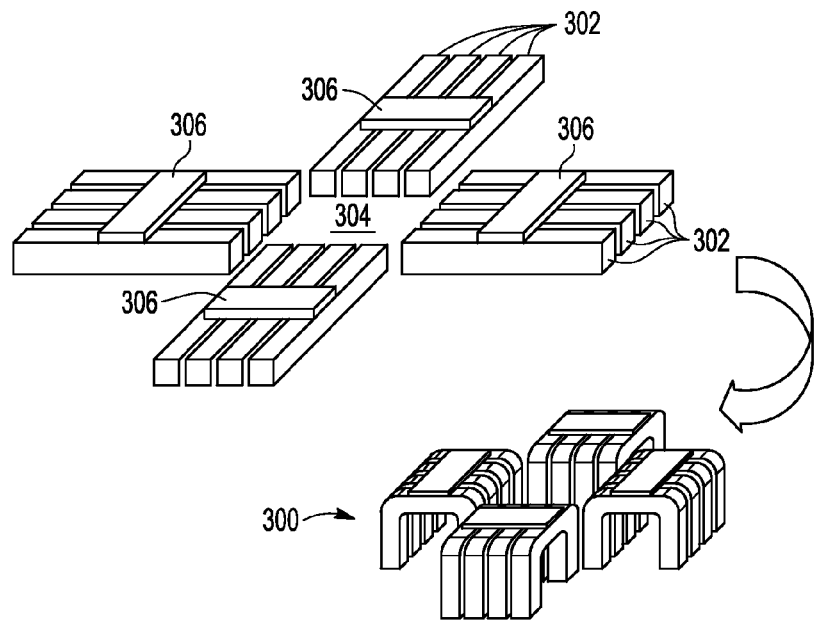
FIG. 3 is a diagram illustrating a process of preparing a metal wire layer for encapsulation in a rigid interconnect structure in accordance with at least one embodiment of the present disclosure.

FIG. 3 illustrates the process of preparing a metal wire layer 300 for stacking in accordance with at least one embodiment of the present disclosure. In the depicted diagram, metal wires 302 are arranged so as to extend out from a central area 304 that corresponds to a location of the cavity 130 (FIG. 2). In the depicted example, the metal wires 302 are grouped into four sets. As another example, the metal wires 302 could radiate out from the central area in a substantially circular shape. The metal wires 302 can comprise as a principal component, for example, one or more of copper (Cu), aluminum (Al), gold (Au), silver (Ag), and nickel (Ni). In one embodiment, thermoplastic tape or a non-conductive clip may be used to physically separate the metal wires 302 of the metal wire layer 300, as well as to physically separate metal wire layers 300 from each other when stacked, so as to prevent shorts between the metal wires 302. In the illustrated embodiment, a strip 306 of thermoplastic tape is used for each of the four sets of metal wires 302. To create the metal wire layer 300, the metal wires 302 are bent or otherwise manipulated to form a horizontal member and two vertical members for each metal wire 302. In other embodiments, the metal wire layers 300 may be manipulated into other combinations of vertical members and horizontal members to achieve the desired routing of the metal wires 302 in the resulting rigid interconnect structure 108.

Figure 4:
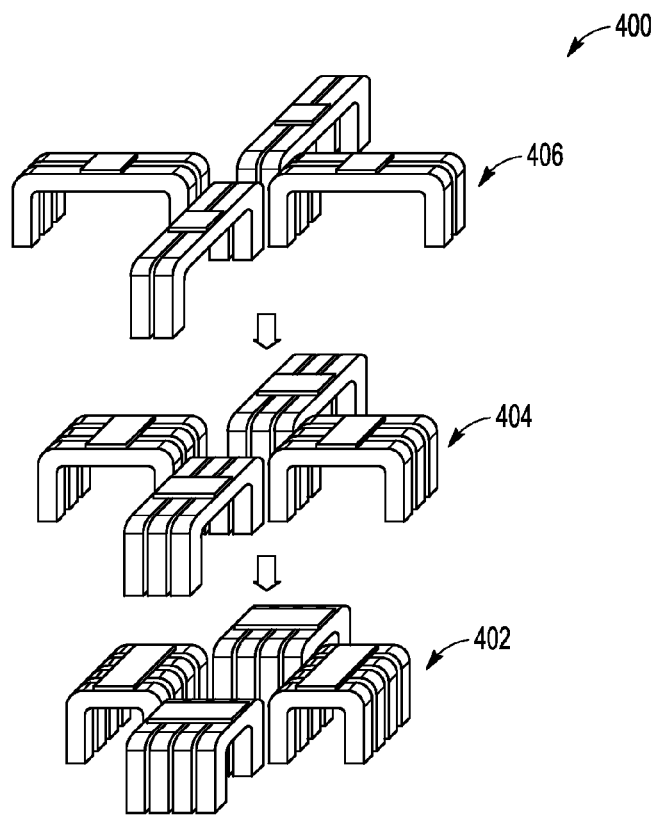
FIG. 4 is a diagram illustrating a process of stacking metal wire layers in preparation for encapsulation in accordance with at least one embodiment of the present disclosure.

FIG. 4 illustrates a process of the stacking of metal wire layers to generate a metal wire stack 400 in accordance with at least one embodiment of the present invention. In the depicted example, the metal wire stack 400 comprises three metal wire layers (metal wire layers 402, 404, and 406) formed in accordance with the process described with respect to FIG. 3 and then stacked one on top of the next. The metal wire layers 402, 404, and 406 are dimensioned successively larger so as to permit it to stack on top of the lower metal wire layer with sufficient physical separation between metal wires 302 of each metal wire layer, as well as being dimensioned so that one end of each metal wire 302 of a metal wire layer is positioned in a corresponding location of the area 304 that ultimately will correspond to the location of a corresponding bond pad 122 of the die 106 and the other end of each metal wire 302 is positioned in a corresponding location of the perimeter of the area 304 that ultimately will correspond to the location of a corresponding bond pad 124 of the package substrate 104.

Figure 5:
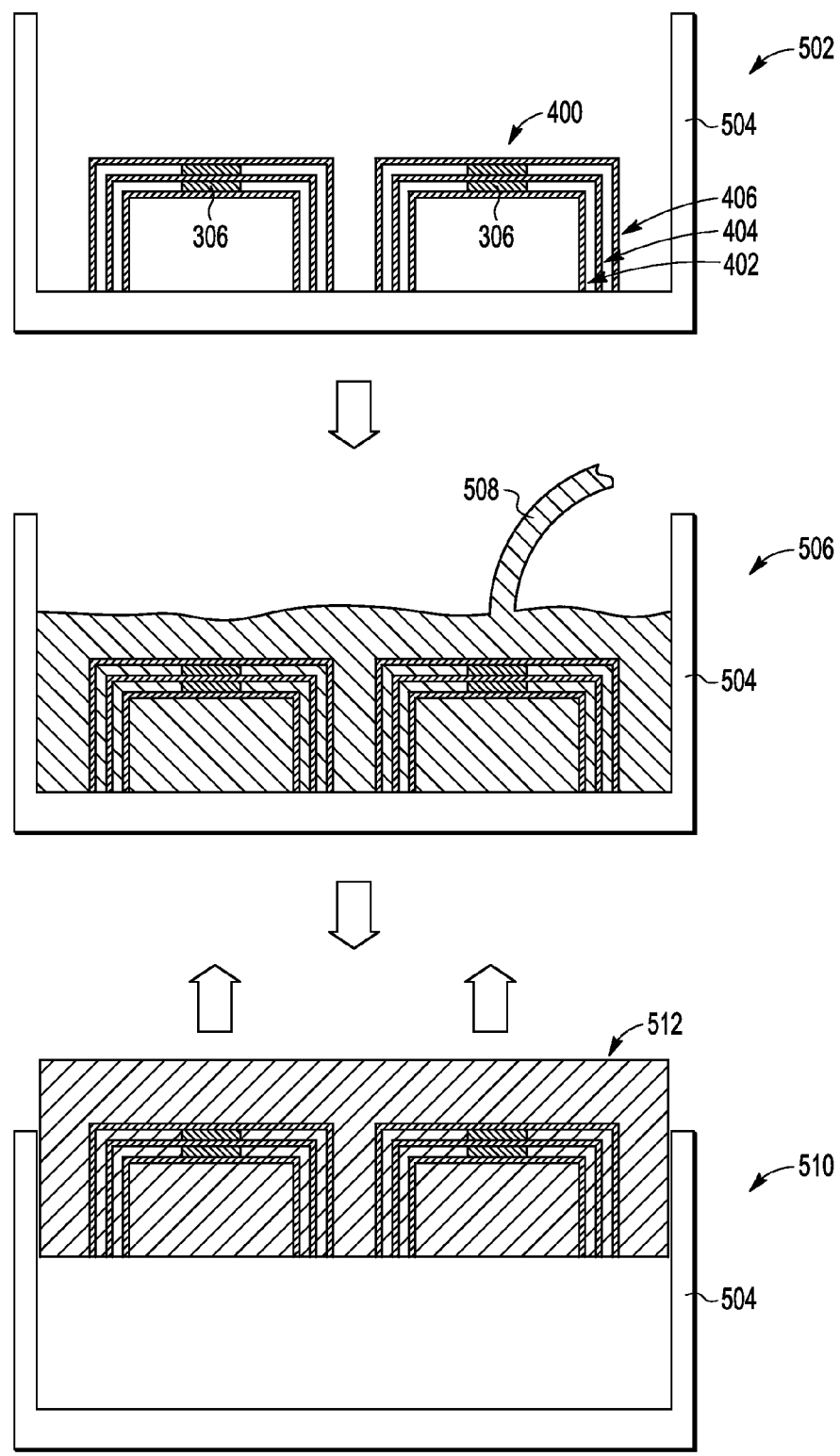
FIG. 5 is a diagram illustrating a process of encapsulating stacked metal wire layers in a molding compound to form a rigid interconnect structure in accordance with at least one embodiment of the present disclosure.

FIG. 5 illustrates a process of encapsulating the metal wire stack 400 by molding the rigid dielectric structure 128 around the metal wire stack 400 in accordance with at least one embodiment of the present disclosure. As illustrated by cross-section view 502, a mold release material is applied to a mold frame 504 contoured to provide the desired shape of the rigid dielectric structure 128 and the metal wire stack 400 then is positioned in the mold frame 504. As illustrated by cross-section view 506, a molding compound 508 is then poured or otherwise transferred to the mold frame 504 so that the metal wire stack 504 is encapsulated by the molding compound 508. As illustrated by cross-section view 510, after the molding compound 508 has cured or set, the resulting workpiece 512 is removed from the mold frame 504.

The molding compound 508 can comprise any of a variety of dielectric molding compounds that cure or set into a rigid structure, including, but not limited to, an epoxy (such as FR4 or BT resin or a liquid encapsulant), an organic plastic substrate (such as polyethylene terephthalate (PET), polyvinyl chloride (PVC), and polycarbonate), and ceramic, and the like. For example, the molding compound 508 can include epoxy resins, phenolic hardeners, silicas, catalysts, pigments, and mold release agents. The molding compound 508 can include, for example, so-called "green molding compound" that is highly moisture resistant and thus reduce the occurrence of "popcorn" failures in plastic IC packages. Alternatively, low-alpha molding compound, which contains smaller quantities of radioactive isotopes, may be used to reduce the probability of an alpha event impacting operation of the device. Any of a wide range of standard mold compounds may be used due to the rigid nature of the resulting dielectric structure 128, which lessens the potential for wire shorting and the wire sweep issue.

Figure 6:
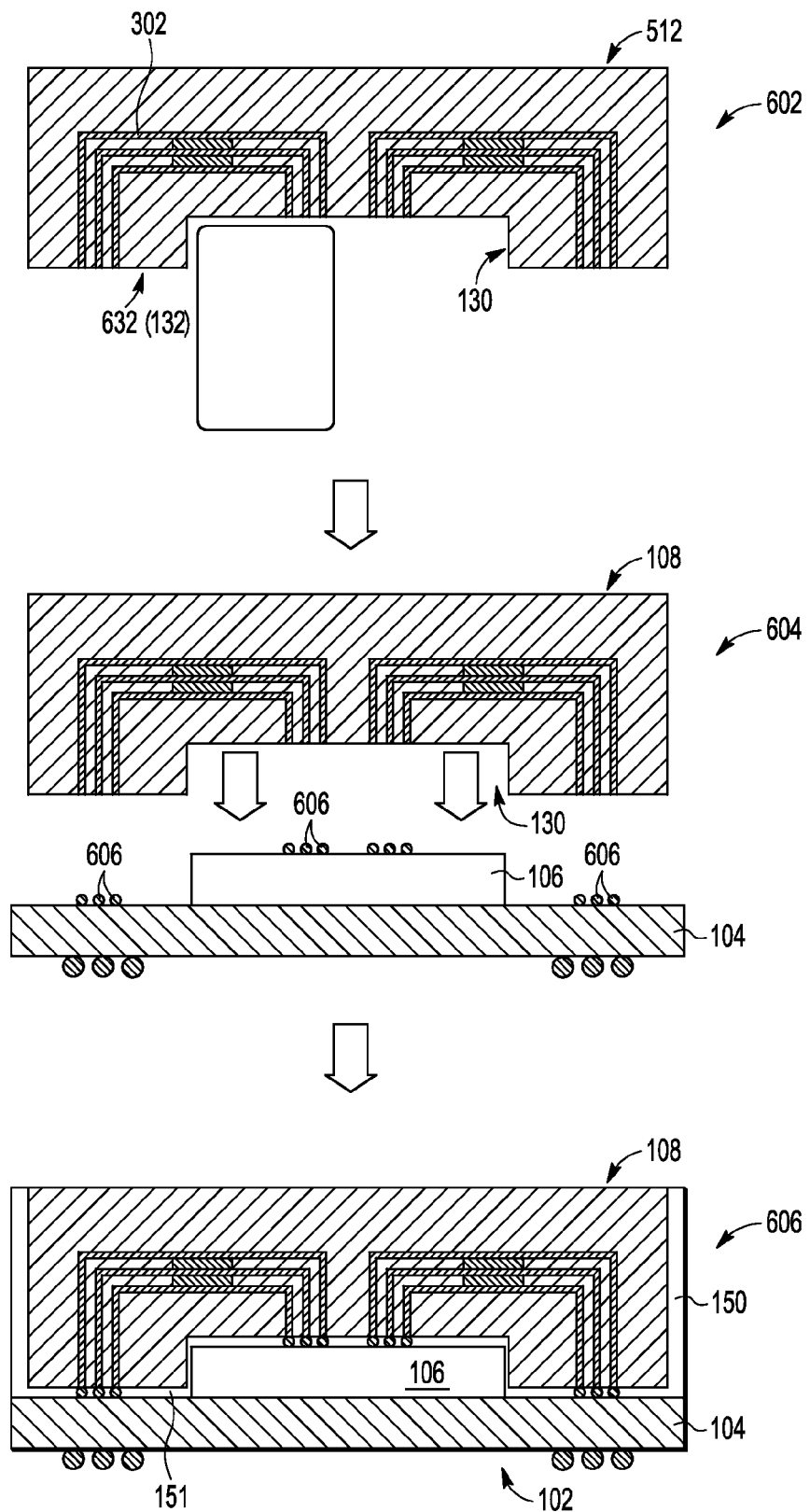
FIG. 6 is a diagram illustrating a process of fabricating a device package using a rigid interconnect structure in accordance with at least one embodiment of the present disclosure.

FIG. 6 illustrates a process of generating the rigid interconnect structure 108 from the workpiece 512 and a process of fabricating the device package 102 using the resulting rigid interconnect structure 108 in accordance with at least one embodiment of the present disclosure. As illustrated by cross-section view 602, a material removal process is used to form the cavity 130 at the bottom surface 632 (corresponding to bottom surface 132) of the workpiece 512. The cavity 130 may be so formed through, for example, selective chemical etching, laser etch or ablation, or mechanical grinding and polishing using, for example, a diamond or silicon carbide abrasive wheel as a cutting tool. Further, the material removal process also may be applied to the surface 632 so as to render the surface 632 more flat, to remove left-over molding flash, to roughen the metal of the metal wires 302 exposed at the surface 632 for improved solder adhesion or bond pad adhesion, and the like.

Figure 9:
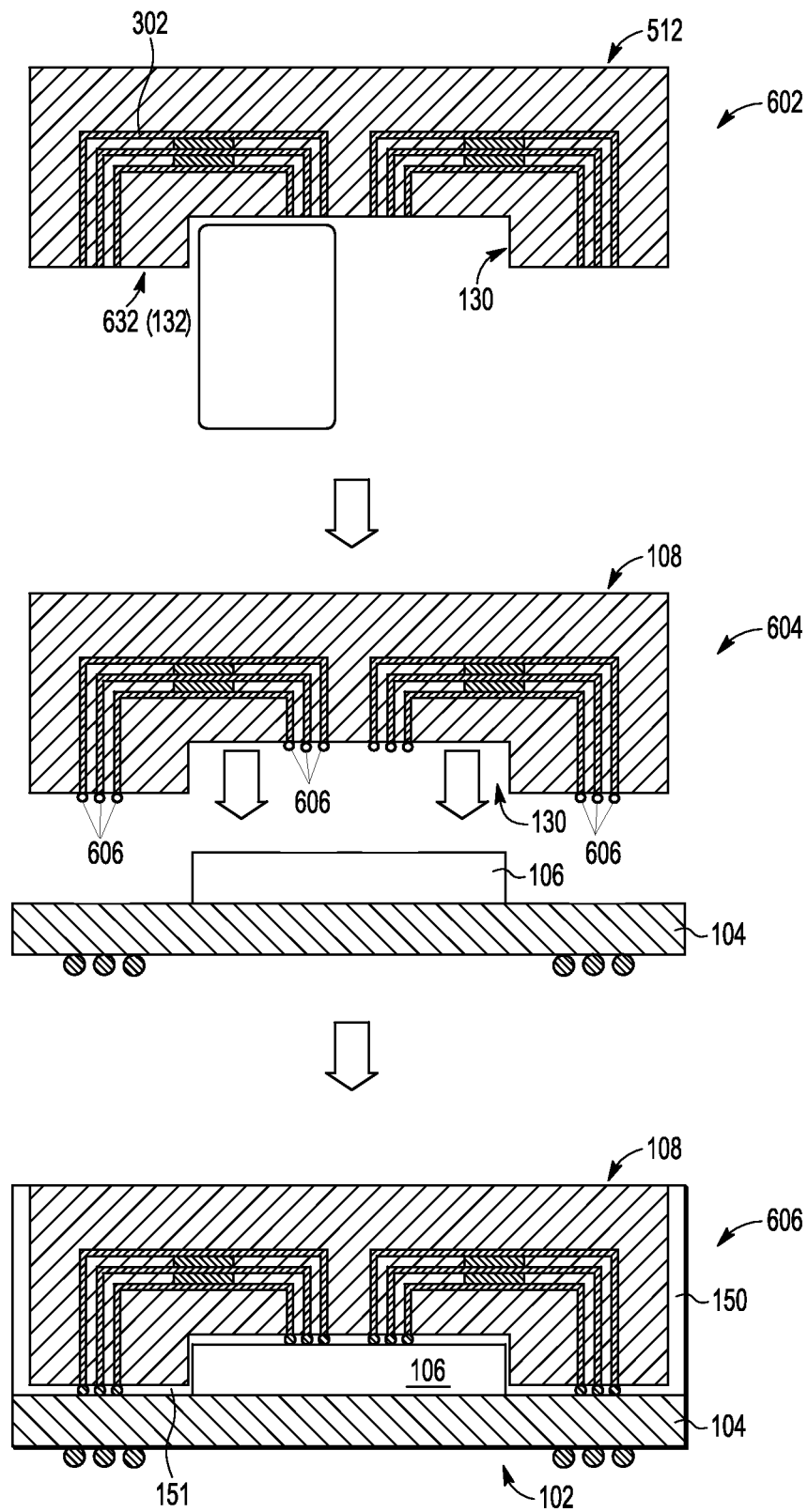
FIG. 9 is a diagram illustrating another process of fabricating a device package using a rigid interconnect structure in accordance with at least one embodiment of the present disclosure.

As illustrated by cross-section view 604, the resulting rigid interconnect structure 108 is positioned so as to overlie the die 106 and package substrate 104 such that the die 106 extends into the cavity 130 of the rigid interconnect structure 108. In the depicted example, the solder bumps 606 are formed at the corresponding bond pads of the die 106 and the package substrate 104 prior to positioning the rigid interconnect structure 108. As described above, the solder bumps 606 instead may be formed at the corresponding bond pads of the rigid interconnect structure 108, as shown in FIG. 9.

As illustrated by cross-section view 606, after positioning the rigid interconnect structure 108, the resulting workpiece is subjected to a solder reflow process to reflow the solder bumps 606, thus forming solder joints that electrically and physically couple the ends of the metal wires 302 of the rigid interconnect structure 108 to the corresponding bond pads 122 (FIG. 1) of the die 106 and the bond pads 124 (FIG. 1) of the package substrate 104. After solder reflow, the underfill structure 150 may be formed using an underfill process to fill any gaps between the rigid interconnect structure 108, the die 106, and the package substrate 104, whereby the underfill structure includes the underfill layer 151 (FIG. 1) disposed between the die 106, the package 104, and the rigid interconnect structure 108. For purposes of this example, fabrication of the device package 102 may be considered complete, and thus the device package 102 may be subjected to burn-in, testing, and other processing in preparation for implementation in the electronic device 100 (FIG. 1).

Figure 7:
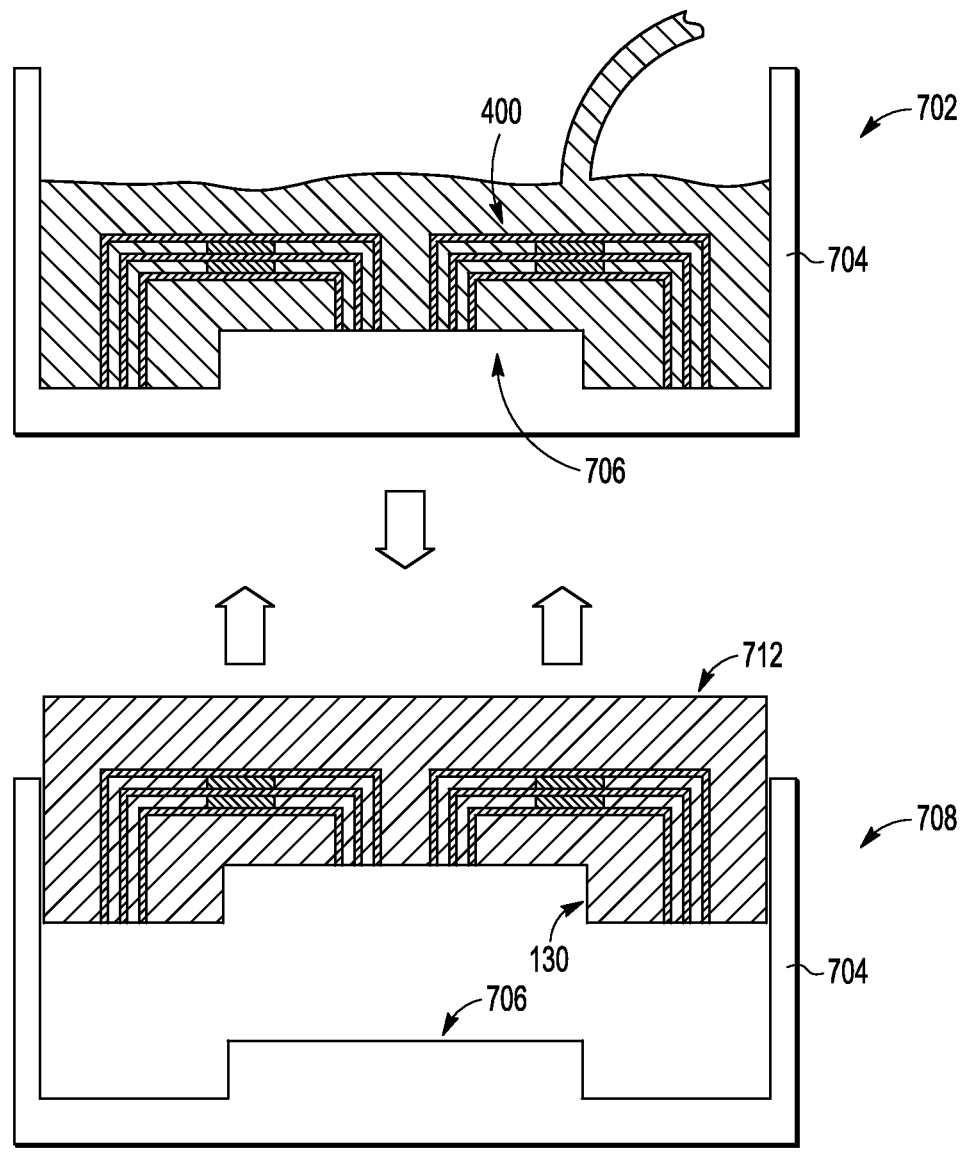
FIG. 7 is a diagram illustrating a process of encapsulating stacked metal wire layers in a molding compound using a mold frame to form a rigid interconnect structure having a cavity dimensioned for a corresponding die in accordance with at least one embodiment of the present disclosure.

FIG. 7 illustrates an alternate approach to forming the cavity 130 in accordance with at least one embodiment of the present disclosure. Rather than employing a material removal process to remove material from the workpiece 512 so as to form the cavity 130, the cavity 130 instead may be formed as part of the molding process. As illustrated by cross-section view 702, a molding frame 704 incorporating a projection 706 corresponding to the dimension and shape of the intended cavity 130 may be used to mold the molding compound 508 around the metal wire stack 400. As illustrated by cross-section view 708, the cavity 130 is thus formed by the projection 706 in the resulting workpiece 712 upon its removal from the mold frame 704. The workpiece 712 then may be further processed in preparation for use as the rigid interconnect structure 108 described above.

Figure 8:
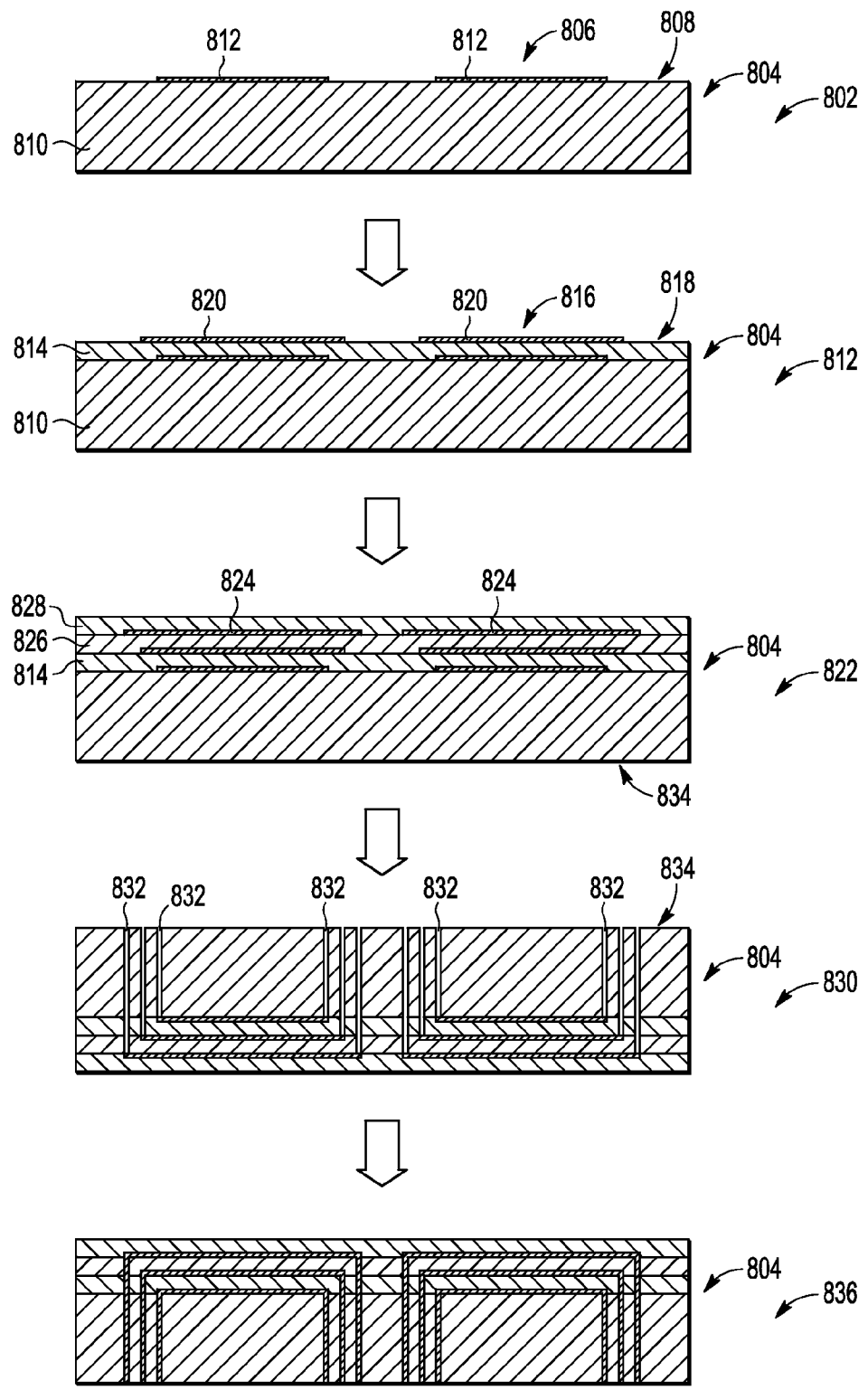
FIG. 8 is a diagram illustrating a process of fabricating a rigid interconnect structure using layer build-up in accordance with at least one embodiment of the present disclosure.

FIG. 8 illustrates a process of fabricating the device package 102 using a layer build-up approach though interleaved dielectric and metal layers in accordance with at least one embodiment of the present disclosure. As illustrated by cross-section view 802, a workpiece 804 (that will ultimately result in the rigid interconnect structure 108) is formed by fabricating a metal layer 806 at a top surface 808 of a base dielectric layer 810. The base dielectric layer can comprise any of a variety of rigid dielectric materials, such as silicon-based materials, quartz-based materials, or ceramic-based materials. The metal layer 806 includes metal traces 812 comprising any of a variety of metals or combinations of metals, such as aluminum, copper, silver, gold, or nickel, and which may be formed using, for example, any of a variety of metallization processes found in conventional semiconductor fabrication. Each of the metal traces 812 implements the horizontal member of a corresponding conductive interconnect 126 (FIG. 1) of a first conductive interconnect layer. As illustrated by cross-section view 812, a second dielectric layer 814 is formed overlying the metal layer 806 and the base dielectric layer 810, and a second metal layer 816 may be formed on a top surface 818 of the second dielectric layer 814. The metal layer 816 includes metal traces 820 implementing the horizontal members of corresponding conductive interconnects 126 of a second conductive interconnect layer. As illustrated by view 822, this process may be repeated to form metal traces 824 at the top surface of a third dielectric layer 826 overlying the second dielectric layer 814 and the metal layer 816. The metal traces 824 implement the horizontal members of a corresponding conductive interconnect 126 of a third conductive interconnect layer. In this example, there are three conductive interconnect layers total, and thus the third metal layer may be capped by a fourth dielectric layer 828 or passivation layer.

As illustrated by view 830, the vertical members of the conductive interconnects 126 are created in the workpiece 804 by etching or otherwise forming vias 832 through the dielectric layers, each via 832 extending from a surface 834 of the workpiece 804 to a corresponding end of a corresponding metal trace at one of the metal layers of the workpiece 804. As illustrated by view 836, the vias 832 then are electroplated or otherwise filled with metal, thereby forming the vertical members of the conductive interconnects 126. The resulting workpiece 804 then may be subjected to a material removal process to form the cavity 103 (FIG. 1), as described above with respect to cross-section view 602 of FIG. 6, to create the rigid interconnect structure 108.

In accordance with one aspect of the present disclosure, a method comprises providing an interconnect structure comprising a plurality of conductive interconnects encased in a dielectric structure, the dielectric structure comprising a cavity at a first surface, and each conductive interconnect comprising a first end at a surface of the cavity and a second end at the first surface. The method further includes coupling each of the plurality of conductive interconnects to a corresponding bond pad of a package substrate and a corresponding bond pad of a die. In one embodiment, a first surface of the die to faces a first surface of the package substrate and coupling each of the plurality of conductive interconnects comprises coupling the first end of each of the conductive interconnects to a corresponding first bond pad of a plurality of first bond pads at a second surface of the die and coupling the second end of each of the conductive interconnects to a corresponding second bond pad of a plurality of second bond pads at the first surface of the substrate. Coupling each of the plurality of conductive interconnects can comprises forming a first solder bump at the first end of each of the conductive interconnects and forming a second solder bump at the second end of each of the conductive interconnects, positioning the interconnect structure, the package substrate, and the die such that each first solder bump overlies a corresponding first bond pad and each second solder bump overlies a corresponding second bond pad, and performing a solder reflow process to couple the plurality of conductive interconnects to the first bond pads and the second bond pads. Alternatively, coupling each of the plurality of conductive interconnects can comprise forming a first solder bump at each first bond pad and forming a second solder bump at each second bond pad, positioning the interconnect structure, the package substrate, and the die such that each first solder bump is proximate to the first end of a corresponding conductive interconnect and each second solder bump is proximate to the second end of a corresponding conductive interconnect, and performing a solder reflow process to couple the plurality of conductive interconnects to the first bond pads and the second bond pads.

In one embodiment, the conductive interconnects each comprise a metal trace having one end connected to the surface of the cavity by a first conductive via and another end connected to the first surface of the interconnect structure by a second conductive via, the first conductive via comprising the first end of the conductive interconnect and the second conductive via comprising the second end of the conductive interconnect. In this embodiment, fabricating the interconnect structure comprises forming a plurality of dielectric layers interleaved with a plurality of metal layers, each metal layer comprising the metal trace of each of a corresponding subset of the conductive interconnects, and forming the first and second conductive vias of the conductive interconnects through one or more of the plurality of dielectric layers.

In one embodiment, the conductive interconnects comprise metal wires, the dielectric structure is composed of a molding compound, and fabricating the interconnect structure comprises stacking a plurality of metal wire layers in the mold frame, each metal wire layer comprising a corresponding subset of the metal wires, each metal wire of a metal wire layer electrically isolated from the metal wires of the same metal wire layer and the other metal wire layers, and transferring the molding compound to the mold frame to encapsulate the plurality of metal wire layers.

Coupling each of the plurality of conductive interconnects to a corresponding bond pad of a package substrate and a corresponding bond pad of a die can comprises positioning the interconnect structure relative to the die and package substrate such that the cavity encases a surface of the die and the surface of the interconnect structure is proximate to a surface of the substrate, and performing a solder reflow process to couple the first end of each of the plurality of conductive interconnects to a corresponding bond pad at the surface of the die and to couple the second end of each of the plurality of conductive interconnects to a corresponding bond pad at the surface of the package substrate.

In accordance with another aspect of the present disclosure, a method comprises encapsulating a plurality of metal wires in a dielectric molding compound to form a molded interconnect structure, and after encapsulating the plurality of metal wires, coupling each of the plurality of metal wires to a corresponding bond pad of a package substrate and a corresponding bond pad of a die. The method further can include forming a cavity at a first surface of the molded interconnect structure, the cavity dimensioned to accommodate the die and providing access to a first end of each of the plurality of metal wires. Forming the cavity can comprise removing material from the molded interconnect structure at the first surface after encapsulating the plurality of metal wires in the molding compound, wherein removing material from the molded interconnect structure comprises at least one of a mechanical grinding process, a selective chemical etch process, or a laser ablation process. Forming the cavity also can include providing a mold frame having a projection corresponding to the cavity, and wherein encapsulating the plurality of metal wires in the dielectric molding compound comprises encapsulating the plurality of metal wires in the dielectric molding compound using the mold frame.

In one embodiment, the method includes providing a mold frame, positioning the plurality of metal wires in the mold frame, and transferring dielectric molding compound to the mold frame. Positioning the plurality of metal wires in the mold frame can comprises stacking a plurality of metal wire layers in the mold frame, each metal wire layer comprising a corresponding subset of the plurality of metal wires, each metal wire of a metal wire layer electrically isolated from the metal wires of the same metal wire layer and the other metal wire layers.

The method further can include affixing a first surface of the die to a first surface of the substrate and coupling a first end of each of the plurality of metal wires to a corresponding bond pad of a plurality of bond pads at the second surface of the die and electrically coupling a second end of each of the plurality of metal wires to a corresponding bond pad of a plurality of bond pads at the first surface of the substrate.

In accordance with another aspect of the present disclosure, a device package comprises a substrate having a first plurality of bond pads disposed at a first surface of the substrate, a die having a first surface facing the first surface of the substrate and a second surface opposite the first surface, the die further comprising a second plurality of bond pads disposed at the second surface of the die, an interconnect structure comprising a plurality of conductive interconnects encased in a dielectric structure, each of the plurality of conductive interconnects coupled to a corresponding bond pad of the first plurality of bond pads and to a corresponding bond pad of the second plurality of bond pads, and an underfill layer disposed between the interconnect structure and at least one of the first surface of the substrate and the first surface of the die.

In one embodiment, the interconnect structure comprises a cavity at a first surface, the cavity encasing at least the second surface of the die, a plurality of dielectric layers interleaved with a plurality of metal layers, each metal layer comprising one or more metal traces, conductive vias, each conductive via extending from the first surface of the interconnect structure through one or more of the plurality of dielectric layers to connect to a corresponding end of a metal trace, and wherein each of the conductive interconnects comprises one of the metal traces at a corresponding metal layer and the conductive vias connected to the ends of the metal trace. In one embodiment, the interconnect structure comprises a cavity at a first surface proximate to the first surface of the substrate, the cavity encasing at least the second surface of the die, the dielectric structure is composed of a molding compound, a metal wire stack encapsulated by the molding compound, the metal wire stack comprising a plurality of metal wire layers, each metal wire layer comprising a plurality of metal wires electrically isolated from other metal wires of the metal wire stack, and each conductive interconnect comprises a corresponding wire of the metal wire stack. The plurality of metal wire layers can be separated by thermoplastic tape.

In this document, relational terms such as "first," "second," and the like, may be used solely to distinguish one entity or action from another entity or action without necessarily requiring or implying any actual relationship or order between such entities or actions or any actual relationship or order between such entities and claimed elements. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
fabricating an interconnect structure including:
stacking a plurality of metal wire layers in a mold frame, each metal wire layer of the plurality of metal wire layers comprising a corresponding subset of metal wires, each metal wire of a metal wire layer electrically isolated from the metal wires of the same metal wire layer and the other metal wire layers of the plurality of metal wire layers; and
transferring a molding compound to the mold frame to encapsulate the plurality of metal wire layers;
providing the interconnect structure encased in a dielectric structure, the dielectric structure comprising a cavity at a first surface and a plurality of conductive interconnects, and each conductive interconnect comprising a first end at a surface of the cavity and a second end at the first surface; and
coupling each of the plurality of conductive interconnects to a corresponding bond pad of a package substrate and a corresponding bond pad of a die.

2. The method of claim 1, wherein:
a first surface of the die to faces a first surface of the package substrate; and
coupling each of the plurality of conductive interconnects comprises coupling the first end of each of the plurality of conductive interconnects to a corresponding first bond pad of a plurality of first bond pads at a second surface of the die and coupling the second end of each of the plurality of conductive interconnects to a corresponding second bond pad of a plurality of second bond pads at the first surface of the package substrate.

3. The method of claim 2, wherein coupling each of the plurality of conductive interconnects comprises:
forming a first solder bump at the first end of each of the plurality of conductive interconnects and forming a second solder bump at the second end of each of the plurality of conductive interconnects;
positioning the interconnect structure, the package substrate, and the die such that each first solder bump overlies a corresponding first bond pad and each second solder bump overlies a corresponding second bond pad; and
performing a solder reflow process to couple the plurality of conductive interconnects to the first bond pads and the second bond pads.

4. The method of claim 2, wherein coupling each of the plurality of conductive interconnects comprises:
forming a first solder bump at each first bond pad and forming a second solder bump at each second bond pad;
positioning the interconnect structure, the package substrate, and the die such that each first solder bump is proximate to the first end of a corresponding conductive interconnect and each second solder bump is proximate to the second end of a corresponding conductive interconnect; and
performing a solder reflow process to couple the plurality of conductive interconnects to the first bond pads and the second bond pads.

5. A method comprising:
providing an interconnect structure comprising a plurality of conductive interconnects encased in a dielectric structure, the dielectric structure comprising a cavity at a first surface, and each of the plurality of conductive interconnects comprising a first end at a surface of the cavity and a second end at the first surface; and
coupling each of the plurality of conductive interconnects to a corresponding bond pad of a package substrate and a corresponding bond pad of a die;
wherein the plurality of conductive interconnects comprise metal wires;
wherein the dielectric structure is composed of a molding compound; and
wherein fabricating the interconnect structure comprises:
stacking a plurality of metal wire layers in a mold frame, each metal wire layer of the plurality of metal wire layers comprising a corresponding subset of the metal wires, each metal wire of a metal wire layer electrically isolated from the metal wires of the same metal wire layer and the other metal wire layers of the plurality of metal wire layers; and
transferring the molding compound to the mold frame to encapsulate the plurality of metal wire layers.

6. The method of claim 1, wherein coupling each of the plurality of conductive interconnects to a corresponding bond pad of a package substrate and a corresponding bond pad of a die comprises:
positioning the interconnect structure relative to the die and package substrate such that the cavity encases a surface of the die and a surface of the interconnect structure is proximate to a surface of the package substrate; and
performing a solder reflow process to couple the first end of each of the plurality of conductive interconnects to a corresponding bond pad at the surface of the die and to couple the second end of each of the plurality of conductive interconnects to a corresponding bond pad at the surface of the package substrate.

7. A device package fabricated according to the method of claim 1.

8. A method comprising:
stacking a plurality of metal wire layers in a mold frame, each metal wire layer of the plurality of metal wire layers comprising a corresponding subset of metal wires, each metal wire of a metal wire layer electrically isolated from the metal wires of the same metal wire layer and the other metal wire layers of the plurality of metal wire layers;
transferring a dielectric molding compound to the mold frame to encapsulate the plurality of metal wire layers in the dielectric molding compound to form a molded interconnect structure; and
after encapsulating the plurality of metal wire layers, coupling each of the of metal wires of the plurality of metal wire layers to a corresponding bond pad of a package substrate and a corresponding bond pad of a die.

9. The method of claim 8, further comprising:
forming a cavity at a first surface of the molded interconnect structure, the cavity dimensioned to accommodate the die and providing access to a first end of each of the plurality of metal wire layers.

10. The method of claim 9, wherein forming the cavity comprises removing material from the molded interconnect structure at the first surface after encapsulating the plurality of metal wire layers in the molding compound, wherein removing material from the molded interconnect structure comprises at least one of a mechanical grinding process, a selective chemical etch process, or a laser ablation process.

11. The method of claim 9, wherein forming the cavity comprises:

providing a mold frame having a projection corresponding to the cavity.

12. The method of claim 8, further comprising:
providing a mold frame.

13. The method of claim 8, further comprising:
affixing a first surface of the die to a first surface of the package substrate; and
coupling a first end of each of the plurality of metal wire layers to a corresponding bond pad of a plurality of bond pads at the second surface of the die and electrically coupling a second end of each of the plurality of metal wire layers to a corresponding bond pad of a plurality of bond pads at the first surface of the substrate.

14. A device package fabricated according to the method of claim 8.

15. The method of claim 5, wherein coupling each of the plurality of conductive interconnects comprises:
forming a first solder bump at each bond pad of a plurality of first bond pads and forming a second solder bump at each bond pad of a plurality of second bond pads;
positioning the interconnect structure, the package substrate, and the die such that each first solder bump is proximate to the first end of a corresponding conductive interconnect and each second solder bump is proximate to the second end of a corresponding conductive interconnect; and
performing a solder reflow process to couple the plurality of conductive interconnects to the first bond pads and the second bond pads.

16. The method of claim 5, wherein coupling each of the plurality of conductive interconnects to a corresponding bond pad of a package substrate and a corresponding bond pad of a die comprises:
positioning the interconnect structure relative to the die and package substrate such that the cavity encases a surface of the die and a surface of the interconnect structure is proximate to a surface of the package substrate; and
performing a solder reflow process to couple the first end of each of the plurality of conductive interconnects to a corresponding bond pad at the surface of the die and to couple the second end of each of the plurality of conductive interconnects to a corresponding bond pad at the surface of the package substrate.

17. A device package fabricated according to the method of claim 5.

18. The method of claim 1, further comprising:
bending the plurality of metal wire layers to form a horizontal member and two vertical members of each of the plurality of metal wire layers prior to stacking the plurality of metal wire layers.

19. The method of claim 8, further comprising:
bending the plurality of metal wire layers to form a horizontal member and two vertical members of each of the plurality of metal wire layers prior to stacking the plurality of metal wire layers.

* * * * *